(12) United States Patent
Leng

(10) Patent No.: US 12,538,429 B2
(45) Date of Patent: Jan. 27, 2026

(54) RESISTOR-EMBEDDED CIRCUIT BOARD AND METHOD FOR PROCESSING THE RESISTOR-EMBEDDED CIRCUIT BOARD

(71) Applicant: SHENNAN CIRCUITS CO.,LTD., Shenzhen (CN)

(72) Inventor: Ke Leng, Shenzhen (CN)

(73) Assignee: SHENNAN CIRCUITS CO., LTD., Shenzhen (CN)

(*) Notice: Subject to any disclaimer, the term of this patent is extended or adjusted under 35 U.S.C. 154(b) by 676 days.

(21) Appl. No.: 17/565,465

(22) Filed: Dec. 30, 2021

(65) Prior Publication Data

US 2023/0064497 A1 Mar. 2, 2023

Related U.S. Application Data

(63) Continuation of application No. PCT/CN2021/121086, filed on Sep. 27, 2021.

(30) Foreign Application Priority Data

Aug. 26, 2021 (CN) .......................... 202110989113.9

(51) Int. Cl.
*H05K 1/11* (2006.01)
*H05K 1/18* (2006.01)
(Continued)

(52) U.S. Cl.
CPC .............. *H05K 1/188* (2013.01); *H05K 1/183* (2013.01); *H05K 1/0243* (2013.01); *H05K 1/11* (2013.01);
(Continued)

(58) Field of Classification Search
None
See application file for complete search history.

(56) References Cited

U.S. PATENT DOCUMENTS 5,994,997 A * 11/1999 Brown ................. H01C 17/281
338/307
6,225,570 B1 * 5/2001 Ishiyama ............... H05K 1/167
361/762
(Continued)

FOREIGN PATENT DOCUMENTS

| CN | 1735318 A | 2/2006 |
|----|-----------|--------|
| CN | 201797653 U | 4/2011 |

(Continued)

OTHER PUBLICATIONS

International srarch report from China patent office in a counterpart Chinese Patent application No. PCT/CN2021/121086 mailed May 16, 2022 (8 pages).

(Continued)

*Primary Examiner* — Ishwarbhai B Patel

(57) ABSTRACT

A resistor-embedded circuit board and a method for processing the resistor-embedded circuit board are provided by the present disclosure. By opening an embedded-resistor cavity on a substrate, embedding a resistor into the embedded-resistor cavity to acquire a circuit board containing a built-in resistor. By opening the embedded-resistor cavity, it is very easy to realize high-precision control of a shape and a thickness of an embedded resistor, and realize very high-precision resistor-embedding; and it is easy to realize high-precision and massive processing. In a resistor-embedded layer, a resistor is built in a substrate. Then, in a process of pressing, a crack and a relatively large deformation will not be caused after pressing due to an irregular surface of the resistor-embedded layer, thereby improving a reliability and a quality rate of the circuit board.

20 Claims, 3 Drawing Sheets

(51) Int. Cl.
  *H05K 3/00* (2006.01)
  *H05K 3/46* (2006.01)
  *H05K 1/02* (2006.01)

(52) U.S. Cl.
  CPC ......... *H05K 3/0017* (2013.01); *H05K 3/0026* (2013.01); *H05K 3/4652* (2013.01); *H05K 2201/0323* (2013.01); *H05K 2203/025* (2013.01); *H05K 2203/0323* (2013.01)

(56) References Cited

U.S. PATENT DOCUMENTS

| | | | | |
|---|---|---|---|---|
| 6,631,551 | B1 * | 10/2003 | Bowles | H01C 7/005 |
| | | | | 338/308 |
| 6,713,399 | B1 * | 3/2004 | Kao | H01C 17/0652 |
| | | | | 438/700 |
| 7,135,377 | B1 * | 11/2006 | Lai | H05K 1/167 |
| | | | | 438/667 |
| 7,342,804 | B2 * | 3/2008 | Langhorn | H01P 1/268 |
| | | | | 361/792 |
| 8,653,523 | B2 * | 2/2014 | Sato | H10D 86/60 |
| | | | | 257/66 |
| 2004/0108937 | A1 * | 6/2004 | Ernsberger | H05K 1/167 |
| | | | | 338/320 |
| 2006/0049509 | A1 * | 3/2006 | Tsukada | H05K 1/167 |
| | | | | 257/700 |
| 2006/0151202 | A1 | 7/2006 | Das et al. | |
| 2006/0163570 | A1 * | 7/2006 | Renn | H01C 17/08 |
| | | | | 257/48 |
| 2007/0194390 | A1 | 8/2007 | Chinthakindi et al. | |
| 2011/0043987 | A1 * | 2/2011 | Das | H05K 1/162 |
| | | | | 977/932 |
| 2016/0282389 | A1 * | 9/2016 | Wölfel | H01C 7/06 |

FOREIGN PATENT DOCUMENTS

| | | |
|---|---|---|
| CN | 109640520 A | 4/2019 |
| CN | 110312365 A | 10/2019 |
| EP | 2315510 A2 | 4/2011 |
| TW | 200420205 A | 10/2004 |
| WO | 2005002303 A1 | 1/2005 |
| WO | WO2014106331 A1 | 7/2014 |
| WO | WO 2015/071367 * | 5/2015 |
| WO | 2019138404 A1 | 7/2019 |

OTHER PUBLICATIONS

European Search Report, European Application No. 21827371.2, mailed Dec. 17, 2024 (67 pages).

Chinese First Office Action, Chinese Application No. 202110989113.9, mailed Feb. 28, 2025 (19 pages).

Chinese Second Office Action, Chinese Application No. 202110989113.9, mailed Jun. 27, 2025 (20 pages).

European First examination report , European Application No. 21827371.2, mailed Apr. 4, 2025 (68 pages).

* cited by examiner

RESISTOR-EMBEDDED CIRCUIT BOARD AND METHOD FOR PROCESSING THE RESISTOR-EMBEDDED CIRCUIT BOARD

CROSS-REFERENCE TO RELATED APPLICATIONS

The present application is a continuation-application of International (PCT) Patent Application No. PCT/CN2021/121086 filed on Sep. 27, 2021, which claims the foreign Patent Application No. 202110989113.9 filed on Aug. 26, 2021, the entire contents of which are incorporated herein by reference in its entirety.

TECHNICAL FIELD

The present disclosure relates to the field of circuit board technology, in particular to a resistor-embedded circuit board and a method for processing the resistor-embedded circuit board.

BACKGROUND

With an accelerating trend of miniaturizing an electronic product, building a capacitor, a resistor, even a chip, etc. into a circuit board has become a new trend, in particular in a field of high-speed high-frequency products. Since a built-in resistor has no parasitic inductance, a precision of a resistance value is much higher than that of a separation-type-solder resistor, so the built-in resistor has a wide application prospect in high-frequency and high-speed applications.

A traditional built-in resistor is mainly made by planar resistor-embedding and built-in embedded separation-type resistor, but the two ways of built-in resistor-embedding are hard to realize. A resistor-embedded layer of the planar resistor-embedding is thin, a thickness is very difficult to be massively and precisely controlled. During a production process of a circuit board, a crack of a resistor-embedded layer is very easy to occur. An amount of deformation is large during a pressing process, and the thickness cannot fulfill a basic requirement of tensile resistance. Thus, a final precision for embedding a resistor is influence. A risk of low reliability of a circuit board and a low-quality rate of a circuit board are caused by a problem of embedding a fill of a built-in separation-type resistor in a circuit board.

SUMMARY OF THE DISCLOSURE

Embodiments of the present disclosure provide a resistor-embedded circuit board and a method for processing the resistor-embedded circuit board, to solve a problem of low precision and low quality for embedding a resistor in a current resistor-embedding method.

To solve the above technical problem, a technical solution adopted by the present disclosure is: providing a resistor-embedded circuit board, including: a substrate and a conductive trace layer arranged on a surface of the substrate, wherein a resistor is embedded in the substrate, the resistor and the conductive trace layer are electrically connected.

Optionally, the conductive trace layer includes a plurality of conductive lines, one end of the resistor and at least one conductive line are electrically connected, and another end of the resistor and another at least one conductive line are electrically connected.

Optionally, the resistor embedded in the substrate is flush with the surface of the substrate.

Optionally, the resistor includes at least one of a conductive ink, a carbon oil, a conductive resin, and a conductive metal paste.

To solve the above technical problem, another technical solution adopted by the present disclosure is: providing a method for processing a resistor-embedded circuit board, including: providing a substrate and arranging a conductive metal layer on a surface of the substrate; opening an embedded-resistor cavity and embedding a resistor into the embedded-resistor cavity; performing etching on the conductive metal layer of the substrate to acquire a conductive trace layer, wherein the conductive trace layer and the resistor are electrically connected.

Optionally, the providing a substrate and arranging a conductive metal layer on a surface of the substrate includes: providing the substrate and positioning a first conductive metal layer on one side surface of the substrate and a second conductive metal layer on another side surface of the substrate.

Optionally, before the opening an embedded-resistor cavity and embedding a resistor into the embedded-resistor cavity, further including: etching the first conductive metal layer to expose the substrate of an area corresponding to the embedded-resistor cavity.

Optionally, after the opening an embedded-resistor cavity and embedding a resistor into the embedded-resistor cavity, further including: performing grinding on a surface of the substrate on a side of the first conductive metal layer, to flatten surfaces of the substrate and the resistor.

Optionally, the performing etching on the conductive metal layer of the substrate to acquire a conductive trace layer includes: performing developing on the second conductive metal layer to acquire the conductive trace layer, and the conductive trace layer and the resistor are electrically connected.

Optionally, the opening an embedded-resistor cavity and embedding a resistor into the embedded-resistor cavity includes: opening the embedded-resistor cavity on the substrate using a laser technology; embedding an embedded-resistor paste into the embedded-resistor cavity and solidifying the embedded-resistor paste.

The benefits of the present disclosure is: differentiating from related technologies, a resistor-embedded circuit board and a method for processing the resistor-embedded circuit board are provided in the present disclosure. By opening an embedded-resistor cavity on a substrate, embedding a resistor into the embedded-resistor cavity to acquire a circuit board containing a built-in resistor. By opening the embedded-resistor cavity, it is very easy to realize high-precision control of a shape and a thickness of an embedded resistor, and realize very high-precision resistor-embedding; and it is easy to realize high-precision and massive processing. In a resistor-embedded layer, a resistor is built in a substrate. Then, in a process of pressing, a crack and a relatively large deformation will not be caused after pressing due to an irregular surface of the resistor-embedded layer, thereby improving a reliability and a quality rate of the circuit board.

DETAILED DESCRIPTION

To make purposes, technical solutions, and advantages of embodiments of the present disclosure, in conjunction with accompanying drawings of the embodiments of the present disclosure, the technical solutions of the embodiments of the present disclosure are described clearly and completely. Apparently, the embodiments described are only some embodiments of the present disclosure but not all embodiments. Based on the embodiments of the present disclosure, embodiments may be acquired by one skilled in the art other based on the provided embodiments without any creative work, and the other embodiments are also covered by the present disclosure.

In the present disclosure, the terms "first", "second", and "third" are only used for description purposes, and cannot be understood as indicating or implying a relative importance, or implicitly specifying a number of technical features indicated. Thus, a feature defined with "first", "second", and "third" may explicitly or implicitly include at least one such feature. In the description of the present disclosure, "multiple" means at least two, e.g. two, three, etc., unless otherwise specified. All directional indications of the embodiments of the present disclosure (such as up, down, left, right, front, back etc.) are only used to explain relative position relationships, movements and etc. between each components in a certain pose. If the certain pose is changed, then the directional indications are also changed accordingly. In addition, terms "include" and "has" and other forms of them, are intended to cover non-exclusive inclusion. For example, a process, a method, a system, a product, or a device containing a series of operations or units are not limited to the listed operations or units, but optionally further include operations or units that are not listed, or optionally further include other necessary operations or units corresponding to the process, the method, the product, or the device.

"Embodiment" mentioned in the present disclosure means, in conjunction with a certain feature, a structure, or a characteristic described in the embodiment may be included in at least one embodiment of the present disclosure. Appearances of the term in different places in the specification do not necessarily mean a same embodiment, neither mean that an embodiment is individual or alternative to and is mutually exclusive with other embodiments. One skilled in the art explicitly and implicitly understands that, without contradiction, an embodiment described in the present disclosure may be combined with other embodiments. In the following specific embodiments, each of the embodiments is described in detail.

A circuit board in the present disclosure may be a flexible circuit board, a rigid circuit board, or a flex-rigid circuit board.

Figure 1:
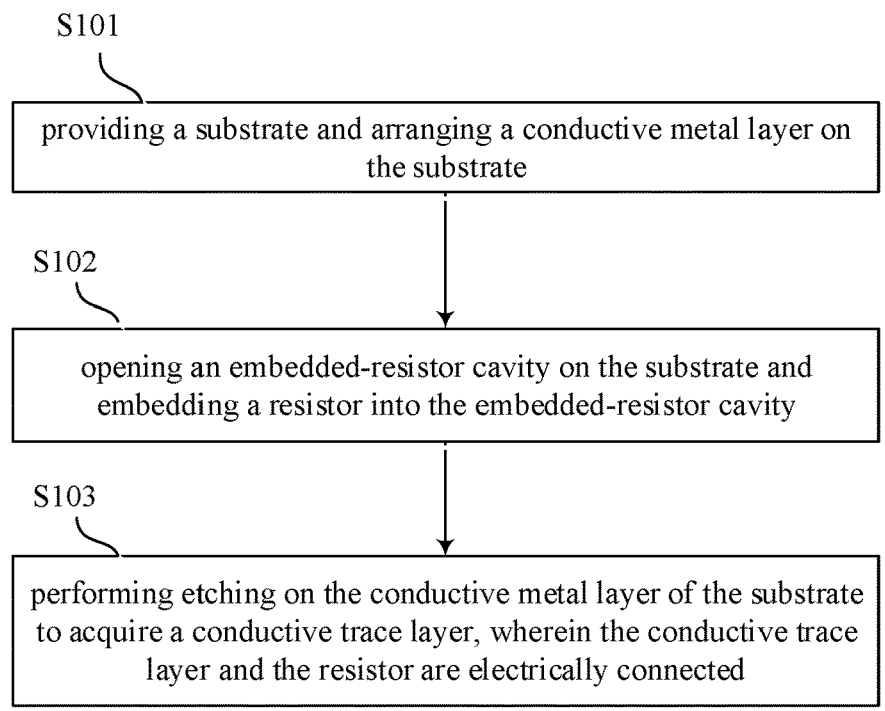
FIG. 1 is a flow chart of a method for processing a resistor-embedded circuit board according to an embodiment of the present disclosure.

Referring to FIG. 1, FIG. 1 is a flow chart of a method for processing a resistor-embedded circuit board according to an embodiment of the present disclosure. The method specifically includes actions or operations at blocks illustrated in FIG. 1.

At block S101: providing a substrate and arranging a conductive metal layer on the substrate.

The substrate may be a rigid substrate, may also be a flexible substrate. Specifically, the rigid substrate may be made of an insulating material, e.g. the rigid substrate is made of a resin material; the rigid substrate is made of a reinforcing material impregnated with a resin adhesive through processes like drying, cutting, and laminating. The flexible substrate may be formed by a substrate including a PI (Polyimide) substrate or a PET (Polyethylene terephthalate) substrate.

Normally, a conductive metal layer arranged on each of two side surfaces of a substrate is commonly seen. However, in the present disclosure, the conductive metal layer arranged on the surfaces of the substrate includes a conductive metal layer arranged on one side surface, also includes conductive layers arranged on two side surfaces. A material of the conductive metal layer may include but not limited to copper, aluminum, iron, nickel, gold, silver, platinum group, chromium, magnesium, tungsten, molybdenum, lead, tin, indium, zinc, or alloys.

At block S102: opening an embedded-resistor cavity on the substrate and embedding a resistor into the embedded-resistor cavity.

The embedded-resistor cavity is opened on the substrate. A shape of the embedded-resistor cavity is determined according to a shape or a graphic of a to-be-embedded resistor. A bottom of the embedded-resistor cavity is flush with one side surface of the substrate, i.e. the bottom of the embedded-resistor cavity and a conductive metal layer of one side of the substrate are connected. After a resistor is embedded into the embedded-resistor cavity, the resistor and the conductive metal layer are electrically connected, thereby supporting the resistor to realize its resistor function.

In a specific embodiment, an embedded-resistor cavity is opened using a laser technology according to an embedded-resistor shape. Specifically, a laser method may be a UV, a picosecond cutting, or $CO_2$ etc. The above laser method may reach an engraving precision of ±5 μm. Understandably, other methods or ways of opening a cavity that reach an engraving precision of ±5 μm may be used in the present disclosure, to open an embedded-resistor cavity.

After the embedded-resistor cavity is opened on the substrate, an embedded-resistor paste is embedded into the embedded-resistor cavity, and the embedded-resistor paste is solidified to realize embedding a resistor in the embedded-resistor cavity. The embedded-resistor paste may be at least one of a conductive ink, a carbon oil, a conductive resin, and a conductive metal paste, i.e. the embedded-resistor paste may be one of, or a combination of two or more of, the conductive ink, the carbon oil, the conductive resin, and the conductive metal paste. Specifically, when the embedded-resistor paste is a combination of the conductive ink, the carbon oil, the conductive resin, and the conductive metal paste, a variety of pastes may be mixed and configured in a certain ratio to acquire an embedded-resistor paste needed. The conductive metal paste may be a copper paste, a silver paste, or other metal pastes. A method for embedding the embedded-resistor paste may include but not limited to a 3-D printing, a traditional screen-printing with a wire/iron mesh, and a laser window squeeze printing with an isolation layer attached. A method for solidifying the embedded-resistor paste may be baking and heating to solidify the embedded-resistor paste. Specifically, a solidifying method needs to be determined according to a characteristic of an embedded-resistor paste.

At block S103: performing etching on the conductive metal layer of the substrate to acquire a conductive trace layer, wherein the conductive trace layer and the resistor are electrically connected.

After embedding the resistor into the substrate, the resistor and the conductive metal layer are in connected status. Then, the conductive metal layer is etched to acquire a conductive trace layer. The conductive trace layer and the resistor are electrically connected to realize a resistor function.

In the present embodiment, by opening an embedded-resistor cavity on the substrate and embedding a resistor into the embedded-resistor cavity, a circuit board containing a built-in resistor is acquired. By opening the embedded-resistor cavity, it is very easy to realize high-precision control of a shape and a thickness of an embedded resistor, and realize very high-precision resistor-embedding and the resistor-embedding precision reaches ±8%; and it is easy to realize high-precision and massive processing. In a resistor-embedded layer, a resistor is built in a substrate. Then, in a process of pressing, a crack and a relatively large deformation will not be caused after pressing due to an irregular surface of the resistor-embedded layer, thereby improving a reliability and a quality rate of the circuit board. In addition, the embedded-resistor circuit board acquired using the processing method of the present embodiment has a great reduction in costs.

Furthermore, please refer to FIGS. 2a-2h. FIGS. 2a-2h are charts of a flow of a method for processing a resistor-embedded circuit board according to another embodiment of the present disclosure. The method includes the actions or operations illustrated with FIGS. 2a-2h.

Figure 2A:
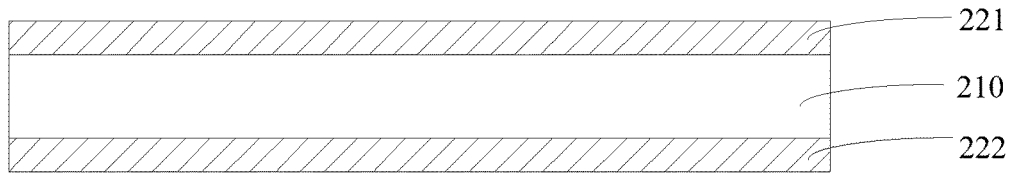
FIG. 2a is a chart of a flow of a method for processing a resistor-embedded circuit board according to another embodiment of the present disclosure.

Operation one: please refer to FIG. 2a. A substrate 210 is provided, a first conductive metal layer 221 is arranged on one side surface of the substrate 210 and a second conductive metal layer 222 is arranged on another side surface of the substrate 210.

Operation two: etching is performed on the first conductive metal layer 221 to expose an area of the substrate 210 corresponding to an embedded-resistor cavity 211.

Figure 2B:
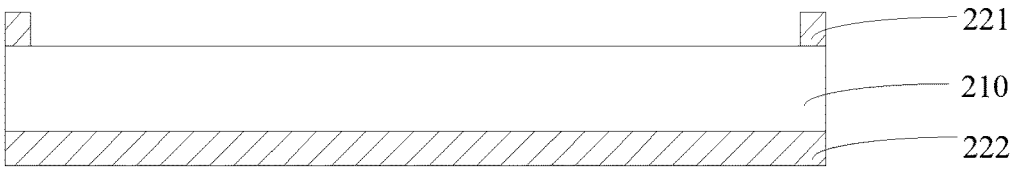
FIG. 2b is another chart of the flow of the method for processing the resistor-embedded circuit board according to the another embodiment of the present disclosure.
Figure 2C:
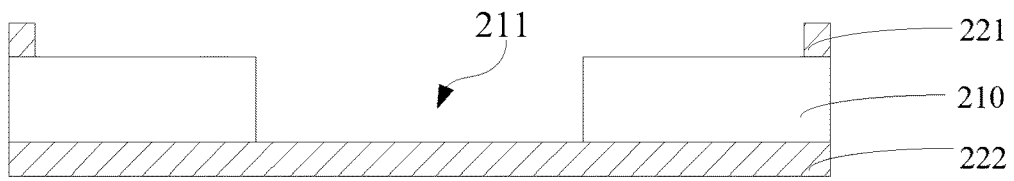
FIG. 2c is another chart of the flow of the method for processing the resistor-embedded circuit board according to the another embodiment of the present disclosure.

Please refer to FIGS. 2b-2c. before the embedded-resistor cavity 211 is opened on the substrate 210, an etching needs to be performed on the first conductive metal layer 221 of one side surface of the substrate 210, to remove an area of a metal layer corresponding to the embedded-resistor cavity 211, and thereby exposing an area of substrate 210 corresponding to the embedded-resistor cavity 211. Then, cavity opening is performed on the exposed substrate 210. A shape of the embedded-resistor cavity 211 matches with a shape or a graphic of a predetermined embedded resistor 230, and a depth of the embedded-resistor cavity 211 and a thickness of the substrate 210 are the same. Therefore, the bottom of the embedded-resistor cavity 211 and a connecting surface connected between the substrate 210 and the second conductive metal layer 222 are on a same level, thereby the embedded resistor 230 and the second conductive metal layer 222 are contacted and connected.

In a specific embodiment, a metal of all parts of the first conductive metal layer 221 other than a positioning part may be etched and removed. In other specific embodiments, the etched and removed area of the first conductive metal layer 221 not only includes an area corresponding to the embedded-resistor cavity 211, but also at least includes an area that facilitates a following grinding process. That is, the etched and removed area of the first conductive metal layer 221 needs to be large enough to support a grinding device to perform the grinding process.

Operation three: the embedded-resistor cavity 211 is opened on the substrate 210 and the resistor 230 is embedded into the embedded-resistor cavity 211.

Figure 2D:
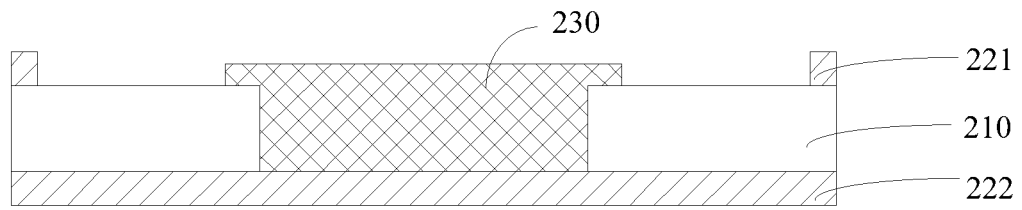
FIG. 2d is another chart of the flow of the method for processing the resistor-embedded circuit board according to the another embodiment of the present disclosure.

Please refer to FIGS. 2c-2d and the operation S102 for a detailed description, which will not be repeated herein.

Operation four: grinding is performed on a surface of the substrate 210 that is on a side of the first conductive metal layer 221 to flatten surfaces of the substrate 210 and the resistor 230.

Figure 2E:
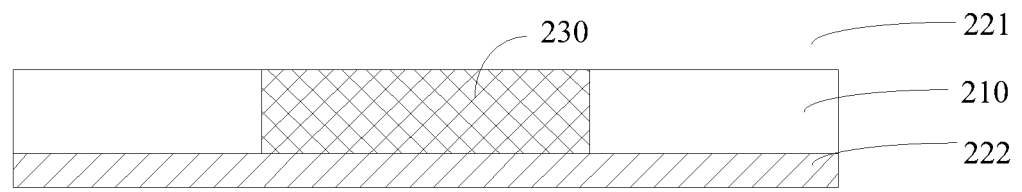
FIG. 2e is another chart of the flow of the method for processing the resistor-embedded circuit board according to the another embodiment of the present disclosure.

Referring to FIGS. 2d-2e, in the last operation, after the resistor 230 is embedded, a thickness of the resistor 230 is slightly greater than a thickness of the substrate 210. That is, a surface of the resistor 230 is higher than a surface of the substrate 210, and in a bump state. By performing a grinding process on the surface of the substrate 210 that is on the side of the first conductive metal layer 221, the bump part of the resistor 230 relative to the surface of the substrate 210 is grinded and removed, thereby flattening the surface of the substrate 210 that is on the side of the first conductive metal layer 221 and the surface of the resistor 230 and realizing that the two surfaces are on the same level. The thickness of the resistor 230 is greater than the thickness of the substrate 210. The grinding process is performed to flatten the two surfaces, which prevents a small thickness of the resistor 230 and an appearance of a dent on a part corresponding to the resistor 230 in the substrate 210 due to a processing condition and a processing error etc., and the grinding process also prevents a bump of the resistor 230. Thus avoiding, in a process of pressing, a crack and a relatively large deformation caused after pressing due to an irregular surface of the resistor-embedded layer, thereby improving a reliability and a quality rate of the circuit board.

In the present operation, the grinding process may be performed with ceramic grinding or sanding belt grinding. After grinding, a flatness of a surface is good without residue, and a pit on the surface is less than 5 μm.

In other specific embodiments, according to a circuit design need, after the surface of the substrate 210 that is on the side of the first conductive metal layer 221 is grinded and flattened, an electroplating may be performed on the surface of the substrate 210 that is on the side of the first conductive metal layer 221 with a metal, and a graphic transfer may be performed as well, to acquire corresponding conductive lines.

Operation five: a development-etching is performed on the second conductive metal layer 222 to acquire a conductive trace layer, and the conductive trace layer and the resistor 230 are electrically connected.

Figure 2F:
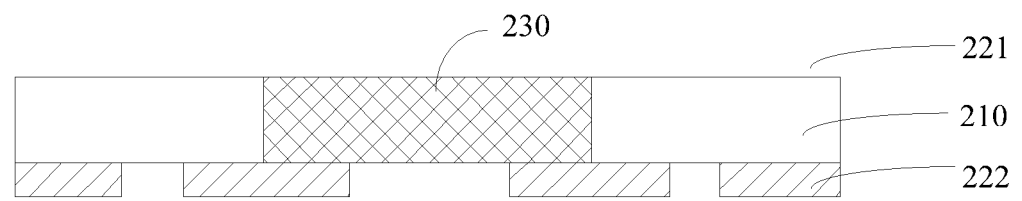
FIG. 2f is another chart of the flow of the method for processing the resistor-embedded circuit board according to the another embodiment of the present disclosure.

Referring to FIG. 2f, the development-etching is performed on the second conductive metal layer 222 on another surface of the substrate 210, i.e. a graphic transfer, to acquire the conductive trace layer, and the conductive trace layer and the resistor 230 are electrically connected. Specifically, the conductive trace layer includes multiple conductive lines, but two or more conductive lines between each other may be electrically connected using the resistor 230. Therefore, a resistance function is realized, i.e. impeding a current. Specifically, it may be a copper PAD of the conductive lines that is electrically connected to the resistor 230. For a purpose of description, the structure of the circuit board in FIG. 2f is called as a resistor-embedded layer.

In the present embodiment, by opening an embedded-resistor cavity 211 on a substrate 210, the embedded-resistor cavity 211 ensures a precision of a shape and a graphic of a resistor 230 embedded, and ensures a precision of the resistor 230 embedded in a plane direction of the substrate 210 and in a direction parallel to the plane of the substrate 210. Furthermore, a laser method has a relatively good engraving precision, and the embedded-resistor cavity 211 with a high-precision may be acquired by using a laser technology to open the embedded-resistor cavity 211 on the substrate 210, and the precision of the resistor 230 embedded in the plane direction of the substrate 210 and in a direction parallel to the plane of the substrate 210 is further improved. By performing grinding on a surface of the substrate 210 after the resistor 230 is embedded, a surface of the resistor 230 is flush with the surface of the substrate 210. Thus, a flatness of the surface of the resistor 230 and the surface of the substrate 210 is ensured, and a precision of the embedded resistor 230 along a direction perpendicular to a plane direction of the substrate 210 is improved. By the present embodiment, a high-precision control of a shape and a thickness of the substrate 210 is realized, a super-high resistor-embedding precision is realized, and it is easy to realize high-precision massive processing. In a resistor-embedded layer, the resistor 230 is built into the substrate 210. Then, in a process of pressing, a crack and a relatively large deformation will not be caused after pressing due to an unevenness of the resistor-embedded layer, thereby improving a reliability and a quality rate of a circuit board.

Figure 2G:
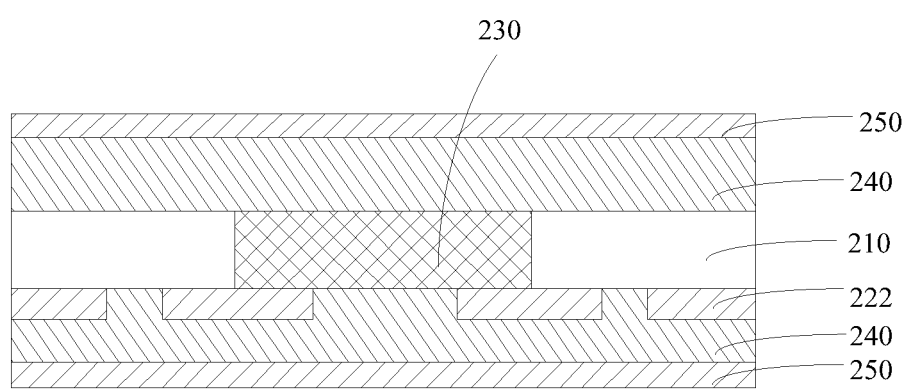
FIG. 2g is another chart of the flow of the method for processing the resistor-embedded circuit board according to the another embodiment of the present disclosure.
Figure 2H:
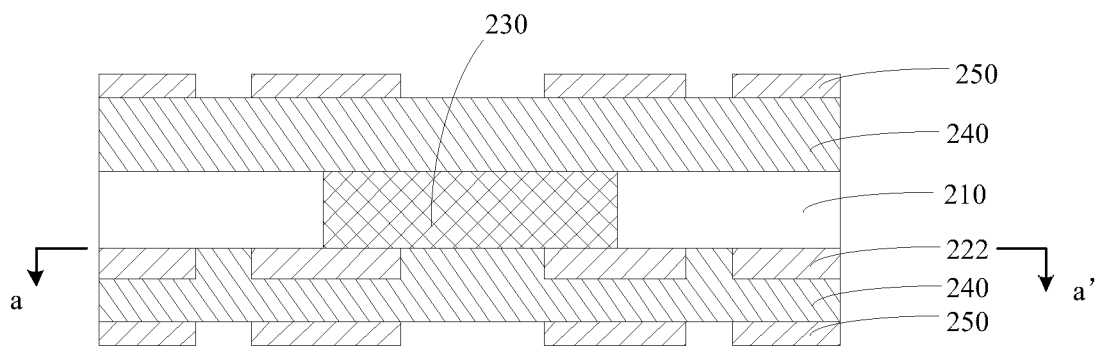
FIG. 2h is another chart of the flow of the method for processing the resistor-embedded circuit board according to the another embodiment of the present disclosure.

In a specific embodiment, referring to FIGS. 2g-2f, after performing development-etching on the second conductive metal layer 222, board arranging is performed. Two sides next to the resistor-embedded layer in turn are an insulating layer 240 and an outer conductive metal layer 250, and pressing is performed in order according to the FIG. 2g, wherein the insulating layer 240 is for insulation, and in the present embodiment, for insulating the resistor-embedded layer from other circuit layers. The insulation layer may be made of prepreg or pp, may also be made of other insulation materials. Referring to FIG. 2h, after pressing, a graphic transfer is performed on the outer conductive metal layer 250, an outer conductive trace layer is formed, and a resistor-embedded circuit board is acquired.

Before pressing is performed, browning is performed on the resistor-embedded layer. A dense organic browning film on a surface of a metal layer or a conductive trace layer is formed, to strengthen a bonding force between the metal layer and the insulating layer 240.

In another embodiment, only one side of a substrate is arranged with a conductive metal layer, a surface of a side without a conductive metal layer is a first surface of a substrate, a surface of a side with a conductive metal layer is a second surface of the substrate. In comparison with the last embodiment, the first surface of the substrate is not covered by the conductive metal layer, and an area of the substrate corresponding to an embedded-resistor cavity is exposed and an etching processing may not be performed. Other operations may refer to the descriptions corresponding to the FIGS. 2a-2h.

Figure 3:
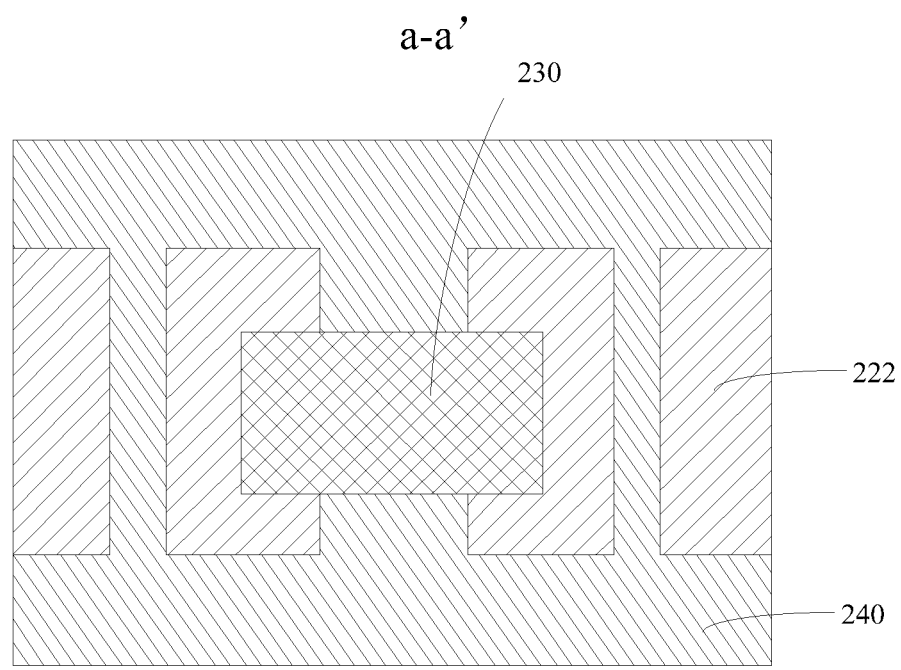
FIG. 3 is a schematic diagram of a cross-section along a-a' direction of a combination of a resistor, a second conductive metal layer, and an insulating layer in FIG. 2h.

A resistor-embedded circuit board is also provided by the present disclosure, referring to FIG. 2h and FIG. 3, FIG. 2h is a structural schematic diagram of a resistor-embedded circuit diagram acquired from a processing method of a resistor-embedded circuit diagram according to the present disclosure, and FIG. 3 is a schematic diagram of a cross-section along a-a' direction of a combination of a resistor 230, a second conductive metal layer 222, and an insulating layer 240 in FIG. 2h.

In the present embodiment, a resistor-embedded circuit board includes a substrate 210 and a conductive trace layer arranged on a surface of the substrate 210, wherein the conductive trace layer corresponds to the second conductive metal layer 222 in FIG. 2h. A resistor 230 is embedded in the substrate 210, and the resistor 230 is electrically connected to the conductive trace layer. In FIG. 2h, the conductive trace layer is embedded in one insulation layer, and another insulation layer is free of the conductive trace layer embedded therein.

The substrate may be a rigid substrate, may also be a flexible substrate. Specifically, the rigid substrate may be made of an insulating material, e.g. the rigid substrate is made of a resin material; the rigid substrate is made of a reinforcing material impregnated with a resin adhesive through processes like drying, cutting, and laminating. The flexible substrate may be formed by a substrate including a PI (Polyimide) substrate or a PET (Polyethylene terephthalate) substrate.

A material of the conductive metal layer may include but not limited to copper, aluminum, iron, nickel, gold, silver, platinum group, chromium, magnesium, tungsten, molybdenum, lead, tin, indium, zinc, or alloys. The conductive trace layer may include multiple conductive lines. One end of the resistor 230 and at least one conductive line are electrically connected, and another end of the resistor 230 and another at least one conductive line are electrically connected. Thus, the resistor 230 is connected to different conductive lines, and a resistance function is realized.

The resistor 230 may be made of at least one of a conductive ink, a carbon oil, a conductive resin, and a conductive metal paste. That is, the resistor 230 may be made of one of or a combination of two or more of the conductive ink, the carbon oil, the conductive resin, and the conductive metal paste. Specifically, when more of the conductive ink, the carbon oil, the conductive resin, and the conductive metal paste are selected, a variety of pastes may be mixed and configured in a certain ratio to acquire an embedded-resistor paste needed, and to make the resistor 230, wherein the conductive metal paste may be a copper paste, a silver paste, or other metal pastes.

Furthermore, a resistor 230 embedded in a substrate 210 is flush with the substrate.

In a specific embodiment, a resistor-embedded circuit board further includes an insulating layer 240 that is arranged on a surface of the substrate 210 and a surface of a second conductive metal layer (conductive trace layer) 222. A surface of an outer conductive metal layer 250 is arranged on the insulating layer 240. The insulating layer 240 is for insulation, and in the present embodiment, for insulating the resistor-embedded layer from other circuit layers. The insulation layer may be made of prepreg or pp, may also be made of other insulation materials.

In the present embodiment, by embedding the resistor 230 into the substrate 210, it is very easy to realize high-precision control of a shape and a thickness of the embedded resistor 230, and realize very high precision resistor-embedding; and it is easy to realize high-precision and massive processing. In a process of pressing, a crack and a relatively large deformation will not be caused after pressing due to an irregular surface of the resistor-embedded layer, thereby improving a reliability and a quality rate of the circuit board.

The above descriptions are only embodiments of the present disclosure, but the scope of protection of the present disclosure is not limited to the above description. Any equivalent structure or equivalent process transformation made by using the contents of the specification and the accompanying drawings, or applied directly or indirectly in other related technology fields, is included in the scope of patent protection of the present disclosure.

What is claimed is:

1. A resistor-embedded circuit board, comprising:
a substrate comprising a first surface and a second surface opposite to the first surface;
a conductive trace layer arranged on one of the first surface and the second surface of the substrate;
a resistor comprising two opposite surfaces and embedded in the substrate, wherein one of the two opposite surfaces is flush with the first surface, and the other of the two opposite surfaces is flush with the second surface; and the resistor and the conductive trace layer are electrically connected; and
two insulation layers, wherein one insulation layer is arranged on the first surface of the substrate, and another insulation layer is arranged on the second surface of the substrate; one of the two opposite surfaces of the resistor is in direct contact with the one insulation layer, and the other of the two opposite surfaces of the resistor is in direct contact with the another insulation layer; and the conductive trace layer is embedded in the one insulation layer, so that the resistor is in direct contact with the conductive trace layer, and the another insulation layer is free of the conductive trace layer embedded therein.

2. The resistor-embedded circuit board as claimed in claim 1, wherein the conductive trace layer comprises a plurality of conductive lines, one end of the resistor and at least one conductive line are electrically connected, and another end of the resistor and another at least one conductive line are electrically connected.

3. The resistor-embedded circuit board as claimed in claim 1, wherein the resistor comprises at least one of or a combination of two or more of a conductive ink, a carbon oil, a conductive resin, and a conductive metal paste.

4. The resistor-embedded circuit board as claimed in claim 1, wherein the substrate is a rigid substrate that is made of resin material, or a flexible substrate that is made of polyimide or polyethylene terephthalate.

5. The resistor-embedded circuit board as claimed in claim 1, wherein the conductive trace layer is made of at least one of or a combination of copper, aluminum, iron, nickel, gold, silver, platinum group, chromium, magnesium, tungsten, molybdenum, lead, tin, indium, and zinc.

6. The resistor-embedded circuit board as claimed in claim 1, wherein the resistor-embedded circuit board further comprises a conductive metal layer positioned on the first surface of the substrate.

7. The resistor-embedded circuit board as claimed in claim 6, wherein the one insulation layer is arranged on a surface of the conductive metal layer, and the insulation layer is made of prepreg or pp.

8. The resistor-embedded circuit board as claimed in claim 1, wherein the substrate defines an embedded-resistor cavity accommodating the resistor, and a depth of the embedded-resistor cavity is the same as a thickness of the substrate.

9. The resistor-embedded circuit board as claimed in claim 1, wherein each conductive trace layer that is embedded in the one insulation layer comprises a surface away from the substrate, and the surface is also embedded in the one insulation layer.

10. A method for processing a resistor-embedded circuit board, comprising:
providing a substrate comprising a first surface and a second surface opposite to the first surface and arranging a conductive metal layer on one of the first surface and the second surface of the substrate;
opening an embedded-resistor cavity on the substrate and embedding a resistor into the embedded-resistor cavity, wherein the resistor comprises two opposite surfaces, one of the two opposite surfaces is flush with the first surface, and the other of the two opposite surfaces is flush with the second surface;
performing etching on the conductive metal layer of the substrate to acquire a conductive trace layer, wherein the conductive trace layer and the resistor are electrically connected; and
forming two insulation layers, wherein one insulation layer is arranged on the first surface of the substrate, and another insulation layer is arranged on the second surface of the substrate; one of the two opposite surfaces of the resistor is in direct contact with the one insulation layer, and the other of the two opposite surfaces of the resistor is in direct contact with the another insulation layer; and the conductive trace layer is embedded in the one insulation layer, so that the resistor is in direct contact with the conductive trace layer, and the another insulation layer is free of the conductive trace layer embedded therein.

11. The method as claimed in claim 10, wherein a shape of the embedded-resistor cavity matches with a shape or a graphic of a predetermined embedded resistor, and a depth of the embedded-resistor cavity and a thickness of the substrate are the same.

12. The method as claimed in claim 10, wherein the providing a substrate and arranging a conductive metal layer on a surface of the substrate comprises:
providing the substrate and positioning a first conductive metal layer on one side surface of the substrate and a second conductive metal layer on another side surface of the substrate.

13. The method as claimed in claim 12, before the opening an embedded-resistor cavity on the substrate and embedding a resistor into the embedded-resistor cavity, further comprising:
etching the first conductive metal layer to expose an area of the substrate corresponding to the embedded-resistor cavity.

14. The method as claimed in claim 13, after the opening an embedded-resistor cavity on the substrate and embedding a resistor into the embedded-resistor cavity, further comprising:
performing grinding on a surface of the substrate on a side of the first conductive metal layer, to flatten a surface of the substrate and a surface of the resistor.

15. The method as claimed in claim 14, after performing grinding on a surface of the substrate on a side of the first conductive metal layer, to flatten surfaces of the substrate and the resistor, comprising:

performing an electroplating on a surface of the substrate that is on a side of the first conductive metal layer with a metal;

performing a graphic transfer; and acquiring the corresponding conductive trace layer.

16. The method as claimed in claim 12, wherein the performing etching on the conductive metal layer of the substrate to acquire a conductive trace layer comprises:

performing a development-etching on the second conductive metal layer to acquire the conductive trace layer, wherein the conductive trace layer and the resistor are electrically connected.

17. The method as claimed in claim 16, wherein the conductive trace layer comprises a plurality of conductive lines, and the conductive lines are connected via the resistor.

18. The method as claimed in claim 16, after performing a development-etching on the second conductive metal layer to acquire the conductive trace layer, comprising:

performing a board arranging;

two sides next to the resistor-embedded layer in turn being one of the two insulation layers, and an outer conductive metal layer; and performing a pressing in order.

19. The method as claimed in 18, before performing a pressing in order, comprising:

performing a browning on the resistor-embedded layer to form a dense organic browning film on a surface of a metal layer or a conductive trace layer.

20. The method as claimed in claim 10, wherein the opening an embedded-resistor cavity on the substrate and embedding a resistor into the embedded-resistor cavity comprises:

opening the embedded-resistor cavity on the substrate using a laser technology;

embedding an embedded-resistor paste into the embedded-resistor cavity and solidifying the embedded-resistor paste.

* * * * *